United States Patent [19]

Andreaggi

[11] 4,422,728
[45] Dec. 27, 1983

[54] LIQUID CRYSTAL MOUNTING AND CONNECTION SCHEME

[75] Inventor: Joseph Andreaggi, Short Hills, N.J.

[73] Assignee: Sangamo Weston, Inc., Atlanta, Ga.

[21] Appl. No.: 230,409

[22] Filed: Jan. 30, 1981

[51] Int. Cl.³ .......................................... G02F 1/133
[52] U.S. Cl. ................................................. 350/334
[58] Field of Search ................. 350/334, 336; 368/242

[56] References Cited

U.S. PATENT DOCUMENTS

| | | | |
|---|---|---|---|
| 3,933,051 | 11/1975 | Reynolds | 350/334 X |
| 3,978,653 | 9/1976 | Burke et al. | 350/334 X |
| 4,012,117 | 3/1977 | Lazzery | 350/334 |
| 4,165,607 | 8/1979 | Fedorowicz et al. | 350/334 X |
| 4,243,455 | 1/1981 | Shiba et al. | 350/336 X |
| 4,294,517 | 10/1981 | Jakubek | 350/345 |
| 4,367,467 | 1/1983 | Emile | 340/765 |

Primary Examiner—John K. Corbin
Assistant Examiner—David Lewis
Attorney, Agent, or Firm—Lowe, King, Price & Becker

[57] ABSTRACT

A device for mounting a liquid crystal display (LCD) to a circuit board without requiring bolts, screws or auxiliary pieces, comprises a holder positioned between the LCD and circuit board and a cover member positioned around the LCD and holder. The cover member is formed with end clips that snap fit around opposite sides of the circuit board to retain the lower surface of the holder in contact with the board. Opposite sides of the holder are formed with through channels containing Zebra elastomeric strips for establishing electrical connections between the circuit board and the LCD. The LCD is retained within the mounting device by resilient members formed on the cover member and holder and maintained in contact with the LCD.

7 Claims, 11 Drawing Figures

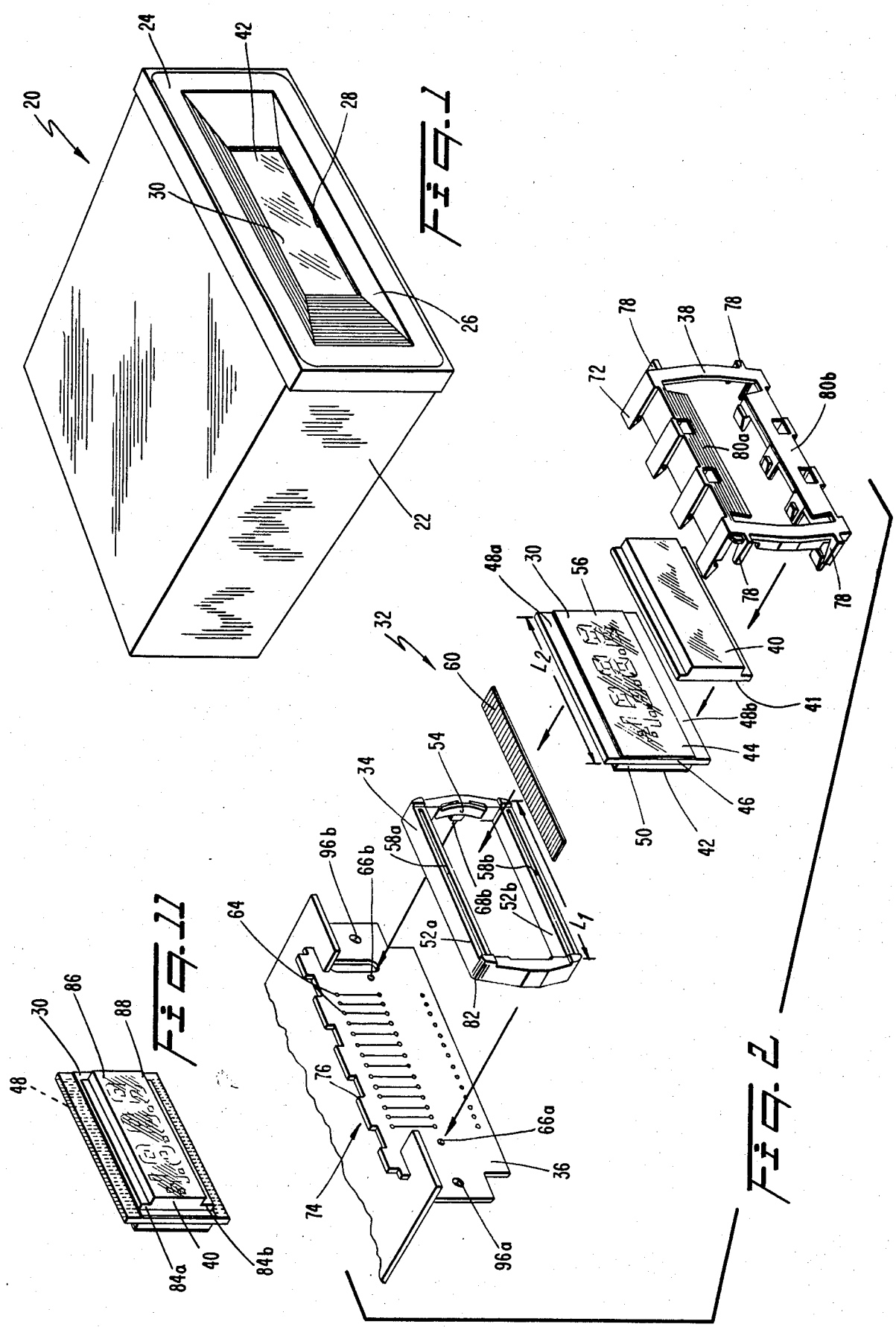

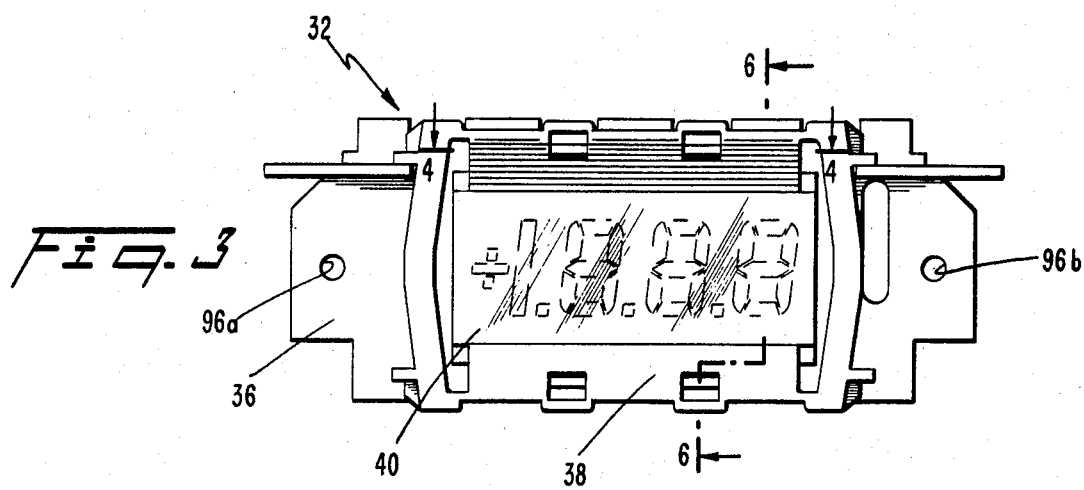
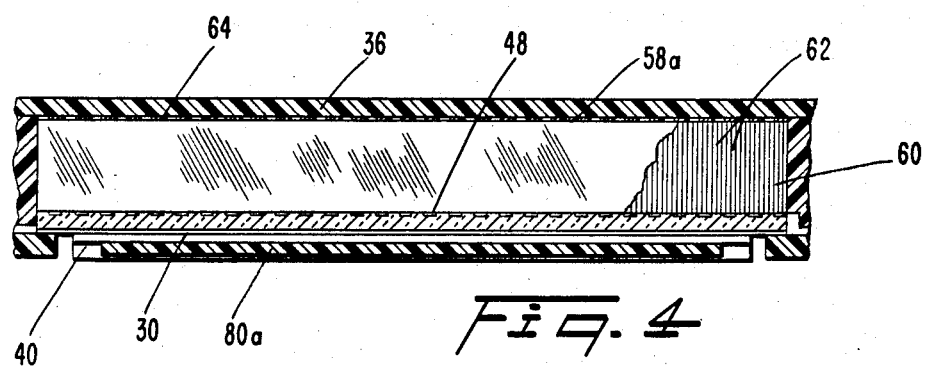

LIQUID CRYSTAL MOUNTING AND CONNECTION SCHEME

CROSS REFERENCE TO RELATED APPLICATIONS

This subject matter is related to application Ser. No. 230,408, filed on Jan. 30, 1981, now issued as U.S. Pat. No. 4,367,467, assigned to the assignee of this application.

TECHNICAL FIELD

The present invention relates generally to liquid crystal displays and more particularly toward devices for mounting liquid crystal displays to circuit boards wherein assembly and disassembly are simplified and the integrity of the mount is resistant to shock and vibration.

BACKGROUND ART

Liquid crystal displays (LCD's) are commonly employed to display alphanumeric data obtained by electronic instrumentation in response to measured parameters, such as voltage, current, resistance, etc. A liquid crystal material is one which is birefringent and exhibits interference patterns and polarized light resulting from parallel orientation of large clusters of molecules. Depending upon the magnitude of voltage applied between parallel back plane and segment conductors characters are formed by light reflected from the particular segments upon which the display voltage is applied. Because LCD devices have a very high internal impedance, the current drawn by the devices is small making LCD's desirable for battery-operated instrumentation.

In compact instrumentation, the LCD is typically mounted on a printed circuit board having a conductive pattern for applying electrical signals to corresponding conductors on the surface of the LCD extending from the segment electrodes. The LCD is generally mounted directly on the printed circuit board using mounting bolts, screws or accessory pieces. There is often a critical alignment problem to ensure electrical coupling between the circuit board and LCD which must be taken into account when the LCD is screwed or bolted to the circuit board. LCD assembly time is thus substantial and it is difficult to subsequently disassemble the display for calibration or repair since access must be made to the locking elements which are typically at least partially located behind a front panel. Furthermore, there is a tendency for the mounting bolts or screws to loosen in response to shock or vibration; this problem commonly occurs in hostile environmental such as those to which cockpit-mounted instrumentation is exposed.

One object of the present invention, therefore, is to provide a new and improved device for mounting an LCD to a circuit board.

Another object is to provide a device for mounting an LCD to a circuit board without requiring mounting bolts, screws, accessory pieces or the like.

Another object is to provide a device for mounting an LCD to a circuit board wherein assembly and disassembly are simplified.

A further object of the invention is to provide a device for mounting an LCD to a circuit board that is shock and vibration resistant.

A still further object of the invention is to provide a device for mounting an LCD to a circuit board, the device being inexpensive to manufacture and convenient to install.

An additional object of the invention is to provide a new and improved LCD assembly that is easily assembled and disassembled and is shock or vibration resistant.

A still further object of the invention is to provide a new and improved LCD assembly that does not require mounting screws, bolts or necessary pieces for mounting.

DISCLOSURE OF INVENTION

A device for mounting a liquid crystal display (LCD) to a circuit board comprises a holder positioned between the LCD and board for offsetting the LCD from the surface of the board and maintaining the LCD in registration with a conductive pattern printed on the circuit board. A cover member positioned around the LCD and holder is retained to the circuit board by a set of clips that snap-fit around opposite sides of the board.

Opposite sides of the LCD holder are provided with through channels containing Zebra strips that establish electrical connections between the conductive pattern on the circuit board and the LCD conductors.

The LCD is retained within the holder by an arcuate, resilient spring member formed on an inner surface of the holder. The holder in turn is retained in contact with the surface of the printed circuit board by a pair of inwardly extending, resilient wings formed on opposite sides of the cover member.

The LCD device assembly is thus mounted to the printed circuit board without requiring bolts, screws or accesory pieces, and the resilient members formed on the holder and cover member establish electrical connections between the printed circuit board pattern and LCD conductors independently of shock or vibration applied to the assembly.

BRIEF DESCRIPTION OF THE DRAWINGS

FIG. 1 is a perspective view of an LCD device assembly, in accordance with the invention, within an instrument housing;

FIG. 2 is an exploded view of the LCD device assembly constructed in accordance with the principles of the present invention;

FIG. 3 is a front view of the LCD device assembly including a group of typical LCD display characters;

FIG. 4 is a cross-sectional view of the assembly of FIG. 3 taken along the line 4—4 to expose a Zebra strip forming an electrical connection between the circuit board pattern and LCD conductors;

FIG. 5 is a bottom view of the LCD assembly showing a group of mounting clips snap-fitted around one end of the circuit board;

FIG. 6 is a cross-sectional view of the assembly of FIG. 3 taken along the line 6—6 to illustrate the orientation of the wing members in contact with the LCD lens;

FIG. 11 is a perspective view showing the corrective lens of FIG. 2 positioned on the outer surface of an LCD and projecting the character image outwardly from the LCD.

BEST MODE FOR CARRYING OUT THE INVENTION

Figure 7:
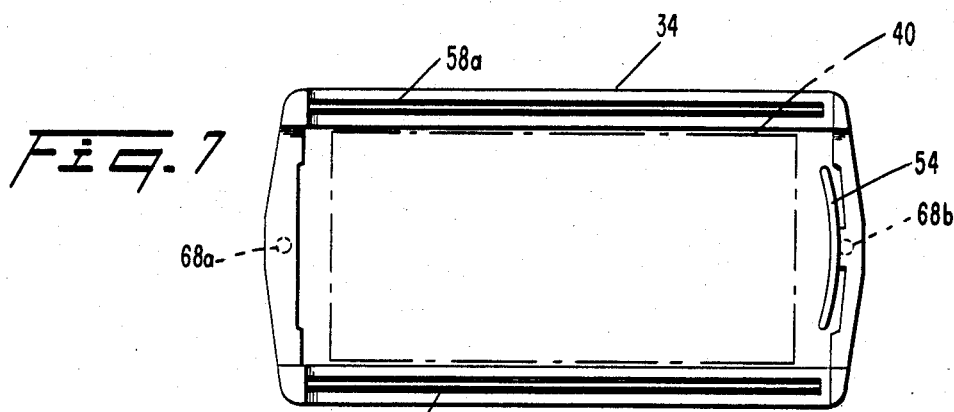
FIG. 7 is a front view of the LCD holder shown in FIG. 2.

Referring to FIG. 1, an instrument 20, such as a panel meter comprises an instrument housing 22 having an ornamental front plate 24 containing a recessed inner portion 26 and display opening 28 to expose a liquid crystal display (LCD) 30. The LCD 30, shown in more detail in FIG. 2, constitutes one element of an LCD device assembly identified generally by the numeral 32. The assembly 32 comprises a holder 34 positioned between a printed circuit board 36 and LCD 30. A cover member 38 extending around the LCD 30 and holder 34 is releasably secured to the circuit board 36 to retain the holder 34 and LCD 30 in proper position on the board. A lens 40, which is preferably optically clear, is located between the LCD 30 and cover 38 to project an image of the alphanumeric characters developed on the surface of LCD 30 to the plane 42 (see FIG. 1) of the outer surface of cover member 38.

The LCD 30, which is a commercially available device manufactured by Hamlin Corporation of Lake Mills, Wis., for example, comprises a back plane electrode 42 that is spaced apart from a character electrode 44 by a central plate 46. The rear surface of the central plate 46 is formed with a series of parallel conductors 48 (see FIG. 11) adapted to apply electrical signals to the character electrodes to form alphanumeric characters at the outer surface of the LCD at electrode 44. The LCD 30 thus has a configuration defined by outwardly extending flanges 48a, 48b and raised central portion 50.

LCD holder 34 comprises a frame having a substantially rectangular configuration corresponding to the configuration of LCD 30. Side members 52a, 52b form seats for supporting flanges 48a, 48b of the LCD. The length $L_1$ of the holder 34 is larger than length $L_2$ of LCD 30 so that with the LCD seated on the holder 34, the LCD is retained in positioned by arcuate spring 54 in resilient contact with end 56 of the LCD (see FIG. 7).

Side members 52a and 52b of holder 34 are formed with through channels 58a, 58b which receive elastomer strips 60 (only one strip is shown in FIG. 2). Strips 60, known as Zebra strips, of a type manufactured by Tecknit Corporation of Cranford, N.J., for example, are formed of alternate conducting and insulating layers defining a series of parallel conductive stripes 62 (see FIG. 4) that establish electrical connections between LCD conductors 48 and a conductive pattern 64 formed on printed circuit board 36. The conductive stripes 62 have positions corresponding generally to the positions of the LCD coductors 48 but have a width substantially less than the width of each LCD conductor and also substantially less than the width of each printed circuit conductor 64. Thus, each LCD conductor 48 and circuit board conductor 64 is in contact with several conductive stripes 62 so that there is no critical alignment necessary the LCD and printed circuit conductors and conductive stripes. Thus, electrical signals applied to the circuit board are applied to the character electrodes 48 of LCD 30 through conductors 64 and 60 to energize the appropriate alphanumeric characters.

The surface of printed circuit board 36 is formed with a pair of through holes 66a, 66b which correspond in position to locator tabs 68a, 68b (see FIG. 7) formed on the underside of LCD holder 34. The tabs 68a, 68b and corresponding through holes 66a, 66b mate when the holder 34 is properly positioned on circuit board 36 with the circuit board conductors 64 and LCD conductors 48 in registration with each other.

Figure 8:
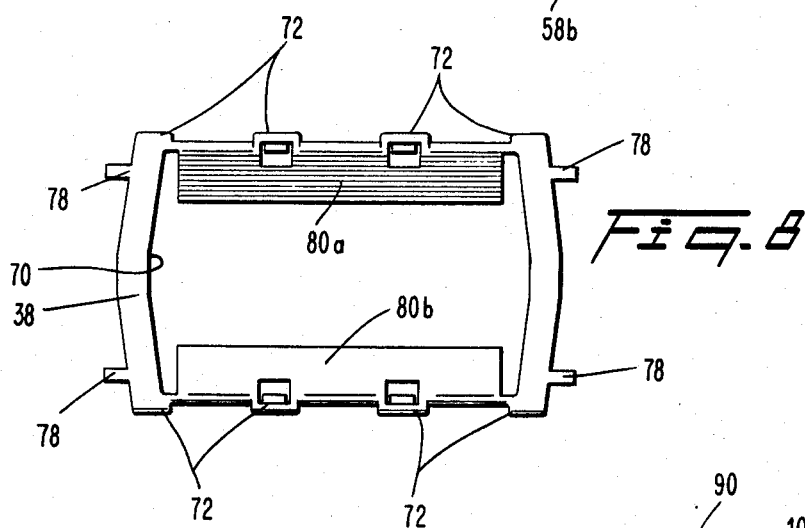
FIG. 8 is a front view of a cover member in accordance with one preferred embodiment of the invention.

Referring to FIG. 8, the cover member 38 comprises a substantially rectangular frame defining an opening 70 through which the alphanumeric characters developed by LCD 30 are exposed (see FIG. 3). Extending downwardly from opposite sides of the cover member 30 are a series of resilient clips 72, as best shown in FIG. 2. These clips 72 snap-fit around opposite sides of the circuit board 36, as shown in FIG. 5. As illustrated in FIG. 2 and FIG. 5, one side of circuit board 36 is formed with a series of cutout sections 76 corresponding in position to positions of the cover member clips 72. The clips 72 are seated within corresponding cutout sections 76 to maintain the cover 38 in proper position on the circuit board 36. It is pointed out, however, that the position of the LCD 30 on circuit board 36 is established by apertures 66a, 66b and locater tabs 68a, 68b independent of the position of the cover 38.

Cover 38 also is formed with a set of downwardly extending members 78 (see FIG. 2) that retain the LCD holder 34 within the cover when the assembly is clipped to circuit board 36, as shown in FIG. 3.

Cover member 38 is also formed with a pair of resilient, downwardly extending wings 80a, 80b which are oriented into contact with lens 40. The wings 80a, 80b thus apply a downwardly acting force on the upper surface of lens 40 tending to retain the lower surface 82 of LCD holder 34 into firm contact with the printed circuit board 36. The lens 40 tends to evenly distribute the forces applied to LCD 30 by wings 80a, 80b and thereby protect the relatively fragile surface of the LCD. Lens 40 also provide optical compensation or correction to the assembly 32 to project an image of the LCD display characters developed on the LCD device 30 which is recessed beneath the plane 42 of the display opening (FIG. 1) outwardly to the display plane. This optical projection improves display parallax as well as improves the aesthetic appearance of the front panel of the instrumentation.

Referring to FIG. 11, the lens 40 is located on the upper surface 44 of LCD 30 at a central position to extend outwardly through cover opening 70, as shown in FIG. 6. The lens 40 is formed with a pair of outwardly extending flanges 84a, 84b and a stepped central portion 86. The central portion 86 is optically flat and the entire lens 40 is formed of a clear plastic or possibly tinted plastic material having an index of refraction suitable to cause an image of the LCD characters to be projected onto the outer surface 88 of the lens 40. A particular type of plastic suitable to provide internal reflections to create the desired image projection is a polycarbonate. Other suitable materials, however, could be used to provide the desired effect.

Thus, in accordance with one aspect of the invention, LCD device assembly 32 is assembled to a printed circuit board 36 without requiring any mounting screws, bolts, or accessory pieces. Assembly is easy since the several components shown in FIG. 2 are simply assembled to each other within cover member 38 and the cover member is then snap-fitted onto the circuit board 36. Disassembly is equally convenient since the resilient clips 32 are manually separated from the opposite sides of circuit board 36 to release the cover and remove components.

Figure 9:
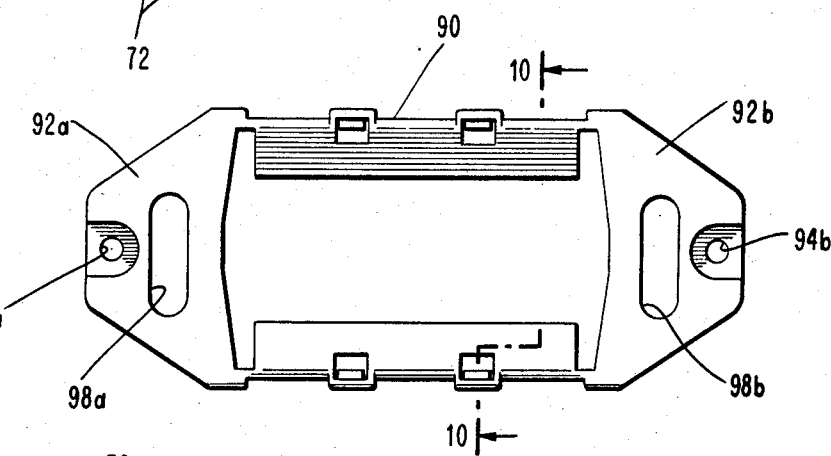
FIG. 9 is a front view of a cover member in accordance with a second preferred embodiment of the invention.
Figure 10:
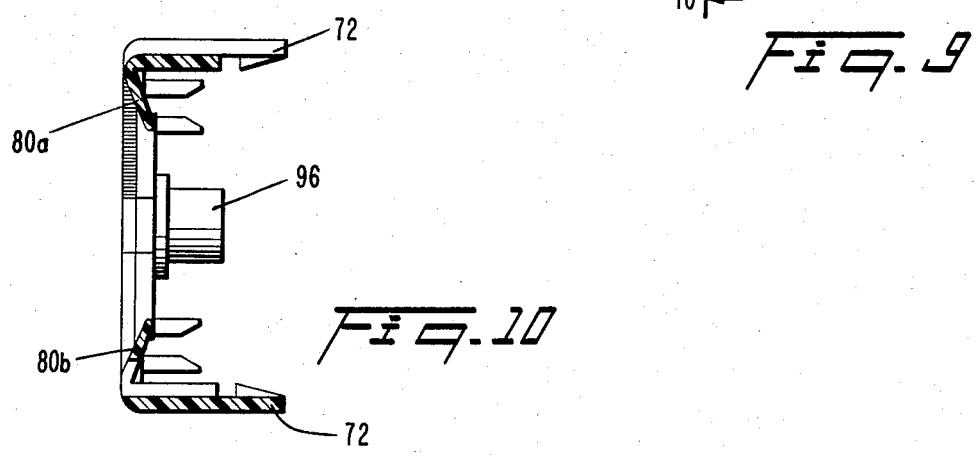
FIG. 10 is a cross-sectional side view of the cover member shown in FIG. 9 taken along the line 10—10.

FIGS. 9 and 10 illustrate a second embodiment of cover 38. Thus, in accordance with the embodiment of FIGS. 9 and 10, a cover member 90 is similar to cover member 38 and additionally it includes a pair of outwardly extending ears 92a, 92b having through holes 94a, 94b to receive mounting bolts for securing the cover to circuit board 36 at apertures 96a, 96b (see FIG. 2). The body of cover member 90 is offset from the upper surface of circuit board 36 by a pair of standoff elements 96 (see FIG. 10) formed around mounting apertures 94a, 94b (only one standoff element is shown in FIG. 10).

Ears 92a, 92b also are provided with a pair of elongated apertures 98a, 98b which are adapted to receive mounting bolts for mounting the assembly 32 to a panel or cover plate (not shown). The elongated configuration of apertures 98a, 98b provide some "play" for proper alignment of the assembly 32 relative to a display opening formed in the panel or cover member.

In this disclosure there is shown and described only the preferred embodiment of the invention, but as aforementioned, it is to be understood that the invention is capable of use in various other combinations and environments and is capable of changes or modifications within the scope of the invention concept as expressed therein. Lens 40, for example (see FIG. 11) may be slightly offset from the surface of LCD 38 to enable the surface 41 of the lens to be exposed to air. This structure may be provided by forming a channel (not shown) in the lens surface 41 to establish clearance between the LCD 38 and surface 41; the air has a tendency to prevent staining of the lens surface 41 due to moisture buildup.

I claim:

1. A device for mounting a liquid crystal display (LCD) to a circuit board having a conductive pattern for applying electrical signals to corresponding conductors on a surface of said LCD, said device comprising:
   a holder positioned between said LCD and said circuit board, said holder including means for maintaining said LCD in registration with said conductive pattern on said circuit board;
   means for establishing electrical connections between said conductive pattern on said board and the corresponding conductors on said LCD;
   a cover member positioned around said LCD and said holder, said LCD being exposed through an opening formed in said cover member; and
   clip means integral with cover means and resiliently contacting a portion of said circuit board for releasably retaining said cover member to said circuit board, wherein said LCD holder comprises a circumferential frame having a length between opposite ends of said holder greater than the length of said LCD, one of said ends containing a spring member, said frame forming a seat for receiving said LCD, said spring member being integral with said holder and biased inwardly into contact with said LCD, said LCD being retained within said frame by said spring member.

2. The device of claim 1, wherein opposite sides of said LCD are formed with flanges, said electrical conductors being located on undersurfaces of said flanges.

3. A liquid crystal display (LCD) device assembly comprising:
   an LCD having electrical conductors for receiving signals;
   a circuit board containing a conductive pattern corresponding in position to the electrical conductors of said LCD;
   a holder positioned between said LCD and said circuit board, said holder including means for maintaining said LCD in registration with said conductive pattern on said circuit board;
   means for establishing electrical connections between said conductive pattern on said circuit board and the corresponding conductors on said LCD;
   a cover member positioned around said LCD and said holder, said LCD being exposed through an opening formed in said cover member; and
   clip means for releasably retaining said cover member to said circuit board, wherein said LCD holder comprises a circumferential frame having a length between opposite ends of said holder greater than the length of said LCD, one of said ends containing a spring member, said frame forming a seat for receiving said LCD, said spring member being integral with said holder and biased inwardly into contact with said LCD, said LCD being retained within said frame by said spring member.

4. A device for mounting a liquid crystal display (LCD) to a circuit board having a conductive pattern for applying electrical signals to corresponding conductors on a surface of said LCD, said device comprising:
   a holder positioned between said LCD and said circuit board, said holder including means for maintaining said LCD in registration with said conductive pattern on said circuit board;
   means for establishing electrical connections between said conductive pattern on said board and the corresponding conductors on said LCD;
   a cover member positioned around said LCD and said holder, said LCD being exposed through an opening formed in said cover member; and
   clip means integral with said cover member and resiliently contacting a portion of said circuit board for releasably retaining said cover member to said circuit board, wherein said registration maintaining means includes at least one locating aperture formed in said circuit board and a corresponding at least one locating tab positioned on said LCD holder to mate with said aperture.

5. A device for mounting a liquid crystal display (LCD) to a circuit board having a conductive pattern for applying electrical signals to corresponding conductors on a surface of said LCD, said device comprising:
   a holder positioned between said LCD and said circuit board, said holder including means for maintaining said LCD in registration with said conductive pattern on said circuit board;
   means for establishing electrical connections between said conductive pattern on said board and the corresponding conductors on said LCD;
   a cover member positioned around said LCD and said holder, said LCD being exposed through an opening formed in said cover member; and
   clip means integral with said cover member and resiliently contacting a portion of said circuit board for releasably retaining said cover member to said circuit board, wherein opposite ends of said cover member are formed with outwardly extending ears, said ears being provided with mounting bolt receiving through-holes for securing said cover member to said circuit board.

6. The device of claim 5, wherein said ears are further formed with elongated mounting bolt receiving slots for securing said cover member to a panel.

7. A device for mounting a liquid crystal display (LCD) to a circuit board having a conductive pattern for applying electrical signals to corresponding conductors on a surface of said LCD, said device comprising:
- a holder positioned between said LCD and said circuit board, said holder including means for maintaining said LCD in registration with said conductive pattern on said circuit board;
- means for establishing electrical connections between said conductive pattern on said board and the corresponding conductors on said LCD;
- a cover member positioned around said LCD and said holder, said LCD being exposed through an opening formed in said cover member; and
- clip means integral with said cover member and resiliently contacting a portion of said circuit board for releasably retaining said cover member to said circuit board, wherein said clip means includes a plurality of resilient clips extending outwardly from said cover member and adapted to clip to opposite sides of said circuit board and wherein one side of said circuit board is formed with cutout sections having portions corresponding to positions of said clips, said clips being seated within said cutout sections of said circuit board.

* * * * *

UNITED STATES PATENT AND TRADEMARK OFFICE
CERTIFICATE OF CORRECTION

PATENT NO. : 4,422,728
DATED : December 27, 1983
INVENTOR(S) : Joseph Andreaggi

It is certified that error appears in the above-identified patent and that said Letters Patent are hereby corrected as shown below:

Column 1, line 52, "environmental" should read -- environments --.

Column 2, line 9, "necessary" should read -- accessory --.

Column 2, line 33, "accesory" should read -- accessory --.

Column 3, line 42, "positioned" should read -- position --.

Column 3, line 55, "coductors" should read -- conductors --.

Column 3, line 61, insert -- between -- between "necessary" and "the".

Column 4, line 10, "30" should read -- 38 --.

Column 4, line 36, "provide" should read -- provides --.

Column 4, line 66, "32" should read -- 72 --.

Column 5, line 27, "38" should read -- 30 --.

Column 5, line 31, "38" should read -- 30 --.

Signed and Sealed this

First Day of May 1984

[SEAL]

Attest:

GERALD J. MOSSINGHOFF

Attesting Officer       Commissioner of Patents and Trademarks